(12) United States Patent
Kim et al.

(10) Patent No.: US 11,900,982 B2
(45) Date of Patent: Feb. 13, 2024

(54) SEMICONDUCTOR DEVICE

(71) Applicant: SK hynix Inc., Icheon-si (KR)

(72) Inventors: Chang Hyun Kim, Icheon-si (KR); Seok Bo Shim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 65 days.

(21) Appl. No.: 17/695,263

(22) Filed: Mar. 15, 2022

(65) Prior Publication Data
US 2023/0162775 A1    May 25, 2023

(30) Foreign Application Priority Data

Nov. 24, 2021 (KR) .................. 10-2021-0163829

(51) Int. Cl.
*G11C 11/406* (2006.01)
*G11C 11/408* (2006.01)

(52) U.S. Cl.
CPC .... *G11C 11/40615* (2013.01); *G11C 11/4087* (2013.01); *G11C 2211/4067* (2013.01)

(58) Field of Classification Search
CPC .......... G11C 11/40615; G11C 11/4087; G11C 2211/4067

USPC ........................................................ 365/222
See application file for complete search history.

(56) References Cited

U.S. PATENT DOCUMENTS

2014/0340976 A1    11/2014  Fujisawa
2015/0098285 A1*    4/2015  Huber ................. G11C 29/025
                                                         365/198

FOREIGN PATENT DOCUMENTS

KR    1020180109215 A    10/2018
KR    1020210143078 A    11/2021

* cited by examiner

*Primary Examiner* — Huan Hoang
(74) *Attorney, Agent, or Firm* — William Park & Associates Ltd.

(57) ABSTRACT

A semiconductor device may include: a first receiver configured to receive a chip select signal from a receiving node to which a termination resistor is coupled and configured to generate a first internal chip select signal; a command pulse generation circuit configured to generate a command pulse for entering into a self-refresh operation based on an internal command address and the first internal chip select signal; and an operation control circuit configured to, when the semiconductor device enters the self-refresh operation based on the command pulse, generate a resistor value change signal that adjusts the value of the termination resistor.

18 Claims, 18 Drawing Sheets

SEMICONDUCTOR DEVICE

CROSS-REFERENCES TO RELATED APPLICATIONS

The present application claims priority under 35 U.S.C. § 119(a) to Korean application number 10-2021-0163829, filed in the Korean Intellectual Property Office on Nov. 24, 2021, the entire disclosure of which is incorporated herein by reference in its entirety.

BACKGROUND

The present disclosure relates to a semiconductor device capable of adjusting the value of a termination resistor during a self-refresh operation.

Among semiconductor devices, DRAM is a volatile memory in which data stored in a memory cell is lost after a predetermined time has elapsed, and needs to perform a refresh operation of re-storing data. The DRAM may perform a self-refresh operation of periodically performing a refresh operation by automatically generating a command for the refresh operation therein.

A semiconductor device may include an ODT (On-Die Termination) circuit for matching external impedance with internal impedance, thereby improving signal integrity.

SUMMARY

In an embodiment, a semiconductor device may include: a first receiver configured to receive a chip select signal from a receiving node to which a termination resistor is coupled and configured to generate a first internal chip select signal; a command pulse generation circuit configured to generate a command pulse for entering into a self-refresh operation based on an internal command address and the first internal chip select signal; and an operation control circuit configured to, when the semiconductor device enters the self-refresh operation based on the command pulse, generate a resistor value change signal that adjusts the value of the termination resistor.

In another embodiment, a semiconductor device may include: an operation control circuit configured to generate a resistor value change signal when a level of a chip select signal transitions so that the semiconductor device enters a self-refresh operation; and an ODT (On-Die Termination) circuit including a termination resistor coupled to a receiving node that receives the chip select signal, and configured to adjust the value of the termination resistor based on the resistor value change signal.

DETAILED DESCRIPTION

In the descriptions of the following embodiments, the term "preset" indicates that the value of a parameter is previously decided, when the parameter is used in a process or algorithm. According to an embodiment, the value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it may indicate that the components may be directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal with a "logic high level" is distinguished from a signal with a "logic low level." For example, when a signal with a first voltage corresponds to a "logic high level," a signal with a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal with a logic high level may be set to have a logic low level according to an embodiment, and a signal with a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

Embodiments of the present disclosure are directed to a semiconductor device capable of adjusting the value of a termination resistor during a self-refresh operation.

Figure 1:
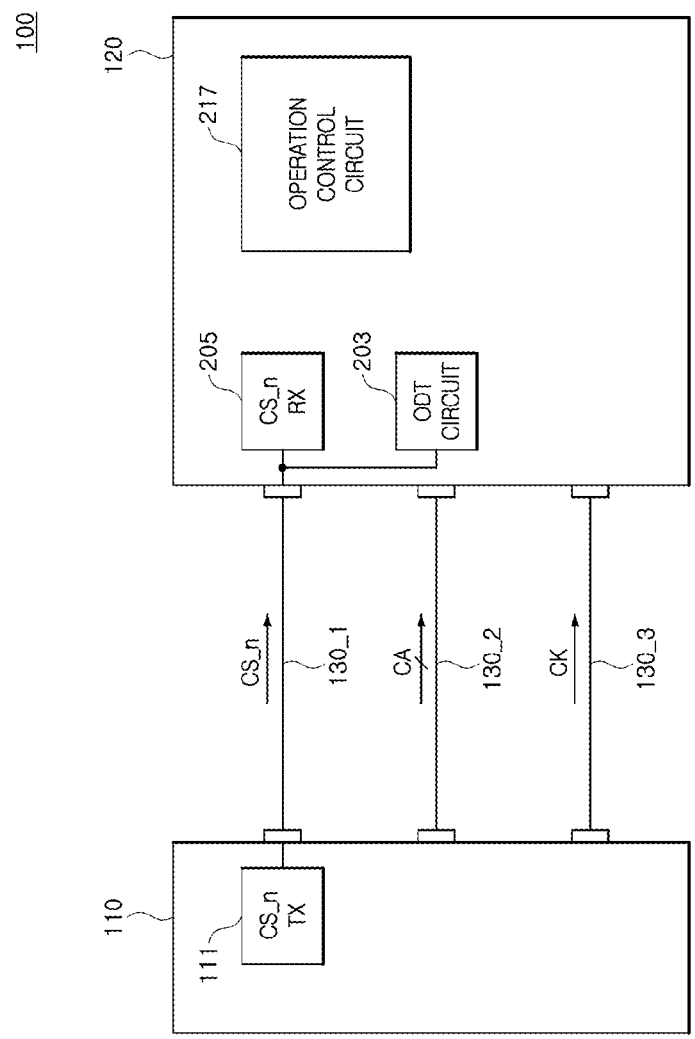
FIG. 1 is a block diagram illustrating a configuration of an electronic system in accordance with an embodiment.

FIG. 1 is a block diagram illustrating a configuration of an electronic system 100 in accordance with an embodiment. As illustrated in FIG. 1, the electronic system 100 may include a controller 110 and a semiconductor device 120. The controller 110 may transmit a chip select signal CS_n to the semiconductor device 120 through a first transmission line 130_1. The controller 110 may transmit a command address CA to the semiconductor device 120 through a second transmission line 130_2. The controller 110 may transmit a clock CK to the semiconductor device 120 through a third transmission line 130_3. The semiconductor device 120 may be implemented as a memory device. The semiconductor device 120 may receive the chip select signal CS_n, the command address CA, and the clock CK from the controller 110, and may perform a self-refresh operation or normal operation. The normal operation may include various internal operations, such as a write operation, read operation, active operation, and precharge operation.

The controller 110 may include a chip select signal transmitter (CS_n TX) 111 configured to drive and output the chip select signal CS_n. The controller 110 may set the level of the chip select signal CS_n through the chip select signal transmitter 111. The controller 110 may change the level of the chip select signal CS_n from a preset level to a first target level such that the semiconductor device 120 enters a self-refresh operation. Then, the controller 110 may change the level of the chip select signal CS_n to the preset level again after a preset period. In the present embodiment, the preset period may be set to one period of the clock CK. In an embodiment, however, the preset period may be set to various periods. When a delay time elapses after the semiconductor device 120 has entered the self-refresh operation, the controller 110 may change the level of the chip select signal CS_n from the preset level to a second target level in order to control power that is consumed by the semiconductor device 120. The delay time indicates the time required for interrupting an input of the command address CA when the semiconductor device 120 enters the self-refresh operation. The difference between the preset level and the second target level may be set to a larger value than the difference between the preset level and the first target level.

The controller 110 may change the level of the chip select signal CS_n from the second target level to the preset level, such that the semiconductor device 120 ends the self-refresh operation.

When an end delay time elapses after the semiconductor device 120 has ended the self-refresh operation, the controller 110 may change the level of the chip select signal CS_n from the preset level to the first target level such that the semiconductor device 120 recognizes the end of the self-refresh operation. Then, the controller 110 may change the level of the chip select signal CS_n to the preset level again after the preset period. The end delay time may indicate the time that is required for the semiconductor device 120 to stably recognize that the self-refresh operation has ended.

The semiconductor device 120 may include an ODT (On-Die Termination) circuit 203, a chip select signal receiver (CS_n RX) 205, and an operation control circuit 217. The ODT circuit 203 may include a termination resistor (not illustrated) and a termination driver (not illustrated) configured to adjust the value of the termination resistor. The chip select signal receiver 205 may receive the chip select signal CS_n from a node to which the termination resistor that is included in the ODT circuit 203 is coupled.

When the level of the chip select signal CS_n transitions from the preset level to the first target level such that the semiconductor device enters the self-refresh operation, the operation control circuit 217 may generate a resistor value change signal (RTT_C of FIG. 2) for adjusting the value of the termination resistor that is included in the ODT circuit 203. The ODT circuit 203 may adjust the value of the termination resistor by controlling the drivability of the termination driver based on the resistor value change signal RTT_C. Therefore, the semiconductor device 120 may stably control the level of the chip select signal CS_n that transitions from the preset level to the second target level after the delay time elapses after the semiconductor device 120 has entered the self-refresh operation. Thus, the semiconductor device 120 may prevent a malfunction that is caused by a level variation of the chip select signal CS_n during the self-refresh operation.

When the level of the chip select signal CS_n transitions from the preset level to the second target level after the delay time elapses after the semiconductor device 120 has entered the self-refresh operation, the operation control circuit 217 may switch a first receiver (207 of FIG. 2) of the chip select signal receiver 205 to a second receiver (209 of FIG. 2) of the chip select signal receiver 205 and may disable the termination resistor that is included in the ODT circuit 203. Thus, the semiconductor device 120 may reduce power that is consumed during the period in which the self-refresh operation is performed.

When the level of the chip select signal CS_n transitions from the second target level to the preset level after the self-refresh operation ends, the operation control circuit 217 may switch the second receiver (209 of FIG. 2) of the chip select signal receiver 205 to the first receiver (207 of FIG. 2) of the chip select signal receiver 205, and enable the termination resistor that is included in the ODT circuit 203.

Figure 2:
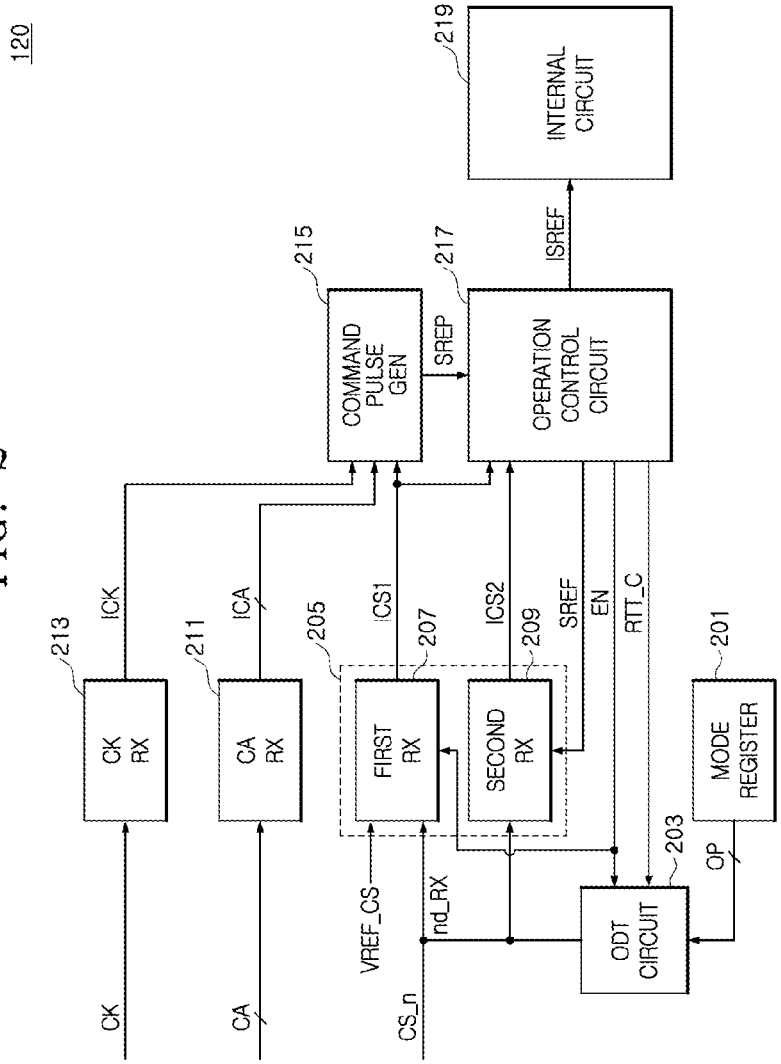
FIG. 2 is a block diagram illustrating a configuration of a semiconductor device, illustrated in FIG. 1.

FIG. 2 is a block diagram illustrating a configuration of the semiconductor device 120, illustrated in FIG. 1. As illustrated in FIG. 2, the semiconductor device 120 may include a mode register 201, the ODT circuit 203, the chip select signal receiver 205, a command address receiver (CA RX) 211, a clock receiver (CK RX) 213, a command pulse generation circuit (COMMAND PULSE GEN) 215, the operation control circuit 217, and an internal circuit 219.

The mode register 201 may store and output a setting code OP. The setting code OP may have a logic level combination for setting the value of a termination resistor (RTT of FIG. 3) that is included in the ODT circuit 203.

The ODT circuit 203 may include the termination resistor (RTT of FIG. 3) that is coupled to a receiving node nd_RX that receives the chip select signal CS_n. The ODT circuit 203 may enable the termination resistor RTT during a period in which an enable signal EN is activated. The ODT circuit 203 may include a termination driver (223 of FIG. 3) configured to adjust the value of the termination resistor RTT. The ODT circuit 203 may adjust the value of the termination resistor RTT by controlling the drivability of the termination driver 223 based on the setting code OP and the resistor value change signal RTT_C. When the resistor value change signal RTT_C is deactivated, the ODT circuit 203 may set the value of the termination resistor RTT according to the logic level combination of the setting code OP. When the resistor value change signal RTT_C is activated, the ODT circuit 203 may set the value of the termination resistor RTT to a preset value. The preset value may be set to various values in different embodiments. For example, when the resistor value change signal RTT_C is activated, the ODT circuit 203 may lower the drivability of the termination driver 223 to a lower value than when the resistor value change signal RTT_C is deactivated, thereby setting the value of the termination resistor RTT to a high value. That is, the resistor value change signal RTT_C may be activated to adjust the drivability of the termination driver 223 in order to stably control the level variation of the chip select signal CS_n. The configuration and operation method of the ODT circuit 203 will be described below in detail with reference to FIG. 3.

The chip select signal receiver 205 may include the first receiver (FIRST RX) 207 and the second receiver (SECOND RX) 209 that are configured to receive the chip select signal CS_n from the receiving node nd_RX to which the termination resistor (RTT of FIG. 3) that is included in the ODT circuit 203 is coupled. The level of the chip select signal CS_n may be set between the level of a supply voltage VDD and the level of a ground voltage VSS. The supply voltage VDD and the ground voltage VSS may be applied from a power pad (not illustrated). In the present embodiment, the preset level of the chip select signal CS_n may be set to the level of the supply voltage VDD, the first target level of the chip select signal CS_n may be set between the level of the supply voltage VDD and a half of the level of the supply voltage VDD, and the second target level of the chip select signal CS_n may be set to the level of the ground voltage VSS. This is only an embodiment, and the preset level, the first target level, and the second target level of the chip select signal CS_n may be set to various levels in different embodiments.

The first receiver 207 may receive the chip select signal CS_n from the receiving node nd_RX and generate a first internal chip select signal ICS1 based on an enable signal EN and a reference voltage VREF_CS. The first receiver 207 may be enabled during a period in which the enable signal EN is activated. The first receiver 207 may set the logic level of the first internal chip select signal ICS1 by comparing the level of the chip select signal CS_n to the level of the reference voltage VREF_CS during the period in which the enable signal EN is activated. The level of the reference voltage VREF_CS may be set between the preset level and the first target level. For example, when the level of the chip select signal CS_n transitions from the preset level to the first target level such that the semiconductor device enters the self-refresh operation, the first receiver 207 may set the logic level of the first internal chip select signal ICS1 to a preset logic level. For another example, when the level of the chip select signal CS_n transitions from the preset level to the second target level after the delay time elapses after the semiconductor device has entered the self-refresh operation, the first receiver 207 may set the logic level of the first internal chip select signal ICS1 to the preset logic level. For still another example, when the level of the chip select signal CS_n transitions from the preset level to the first target level after the end delay time elapses after the self-refresh operation ends, the first receiver 207 may set the logic level of the first internal chip select signal ICS1 to the preset logic level. In the present embodiment, the preset logic level may be set to a logic low level. However, the preset logic level may be set to a logic high level in different embodiments. The first receiver 207 may be implemented as a differential amplifier that amplifies the difference between the level of the chip select signal CS_n and the level of the reference voltage VREF_CS and drives an output node from which the first internal chip select signal ICS1 is output. The configuration and operation method of the first receiver 207 will be described below in detail with reference to FIG. 6.

The second receiver 209 may receive the chip select signal CS_n from the receiving node nd_RX and generate a second internal chip select signal ICS2 based on a self-refresh signal SREF. The second receiver 209 may be enabled during a period in which the self-refresh signal SREF is activated. The second receiver 209 may set the logic level of the second internal chip select signal ICS2 according to the level of the chip select signal CS_n during the period in which the self-refresh signal SREF is activated. For example, when the level of the chip select signal CS_n transitions from the preset level to the second target level after the delay time elapses after the semiconductor device has entered the self-refresh operation, the second receiver 209 may change the logic level of the second internal chip select signal ICS2 from the first logic level to the second logic level. For another example, when the level of the chip select signal CS_n transitions from the second target level to the preset level such that the semiconductor device ends the self-refresh operation, the second receiver 209 may change the logic level of the second internal chip select signal ICS2 from the second logic level to the first logic level. In the present embodiment, the first logic level and the second logic level may be set to a logic high level and a logic low level, respectively. However, the first logic level and the second logic level may be set to a logic low level and a logic high level, respectively, in different embodiments. The second receiver 209 may be implemented as a CMOS (Complementary Metal-Oxide Semiconductor) buffer that drives an output node from the second internal chip select signal ICS2 is output according to the level of the chip select signal CS_n. The second receiver 209 that is implemented as a CMOS buffer may have a lower power consumption than the first receiver 207 that is implemented as a differential amplifier. The configuration and operation method of the second receiver 209 will be described below in detail with reference to FIG. 7.

The command address receiver 211 may receive the command address CA and generate an internal command address ICA. The command address receiver 211 may buffer the command address CA and output the buffered command address as the internal command address ICA.

The clock receiver 213 may receive the clock CK and generate an internal clock ICK. The clock receiver 213 may buffer the clock CK and output the buffered clock as the internal clock ICK.

The command pulse generation circuit 215 may generate a command pulse SREP from the internal command address ICA based on the first internal chip select signal ICS1 in synchronization with the internal clock ICK. When the first internal chip select signal ICS1 has the preset logic level, the command pulse generation circuit 215 may generate the command pulse SREP for entering into the self-refresh operation by decoding the internal command address ICA with a logic level combination for entering into the self-refresh operation. The configuration and operation method of the command pulse generation circuit 215 will be described below in detail with reference to FIG. 8.

The operation control circuit 217 may generate the self-refresh signal SREF, an internal self-refresh signal ISREF, the resistor value change signal RTT_C, and the enable signal EN based on the command pulse SREP, the first internal chip select signal ICS1, and the second internal chip select signal ICS2. The self-refresh signal SREF may be activated until the semiconductor device ends the self-refresh operation after entering the self-refresh operation. The internal self-refresh signal ISREF may be activated until the end delay time elapses after the semiconductor device ends the self-refresh operation. The resistor value change signal RTT_C may be activated to adjust the value of the termination resistor (RTT of FIG. 3), included in the ODT circuit 203, to a preset value. The enable signal EN may be activated to enable the first receiver 207 and the termination resistor RTT that is included in the ODT circuit 203.

The operation control circuit 217 may control the active states of the self-refresh signal SREF and the internal self-refresh signal ISREF based on the command pulse SREP, the first internal chip select signal ICS1, and the second internal chip select signal ICS2. When the semiconductor device enters the self-refresh operation based on the command pulse SREP, the operation control circuit 217 may activate the self-refresh signal SREF and the internal self-refresh signal ISREF. The operation control circuit 217 may enable the second receiver 209 based on the activated self-refresh signal SREF. When the logic level of the second internal chip select signal ICS2 transitions from the second logic level to the first logic level after the self-refresh operation ends, the operation control circuit 217 may deactivate the self-refresh signal SREF. The operation control circuit 217 may disable the second receiver 209 based on the deactivated self-refresh signal SREF. When the first internal chip select signal ICS1 has the preset logic level in a period in which the self-refresh signal SREF is deactivated after the self-refresh operation ends, the operation control circuit 217 may deactivate the internal self-refresh signal ISREF. That is, when the first internal chip select signal ICS1 has the preset logic level after the end delay time elapses after the self-refresh operation ends, the operation control circuit 217 may deactivate the internal self-refresh signal ISREF.

The operation control circuit 217 may control the active state of the resistor value change signal RTT_C based on the command pulse SREP and the second internal chip select signal ICS2. When the semiconductor device enters the self-refresh operation based on the command pulse SREP, the operation control circuit 217 may activate the resistor value change signal RTT_C. That is, when the semiconductor device enters the self-refresh operation, the operation control circuit 217 may adjust the value of the termination resistor (RTT of FIG. 3) that is included in the ODT circuit 203 to a preset value based on the activated resistor value change signal RTT_C. When the logic level of the second internal chip select signal ICS2 transitions from the first logic level to the second logic level, the operation control circuit 217 may deactivate the resistor value change signal RTT_C. That is, when the delay time elapses after the semiconductor device has entered the self-refresh operation, the operation control circuit 217 may set the value of the termination resistor RTT according to the logic level combination of the setting code OP based on the deactivated resistor value change signal RTT_C. Thus, in order to stably control a level variation of the chip select signal CS_n after the semiconductor device enters the self-refresh operation, the operation control circuit 217 may adjust the value of the termination resistor RTT coupled to the chip select signal receiver 205 that receives the chip select signal CS_n when the semiconductor device enters the self-refresh operation, which makes it possible to prevent a malfunction that is caused by the level variation of the chip select signal CS_n during the self-refresh operation.

The operation control circuit 217 may control the active state of the enable signal EN based on the command pulse SREP, the first internal chip select signal ICS1, and the second internal chip select signal ICS2. When the first internal chip select signal ICS1 has the preset logic level in a period in which the self-refresh signal SREF is activated, the operation control circuit 217 may deactivate the enable signal EN. That is, when the delay time elapses after the semiconductor device has entered the self-refresh operation, the operation control circuit 217 may disable the first receiver 207 and the termination resistor (RTT of FIG. 3) that is included in the ODT circuit 203 based on the deactivated enable signal EN. Thus, when the delay time elapses after the semiconductor device has entered the self-refresh operation, the operation control circuit 217 may switch the first receiver 207 of the chip select signal receiver 205 to the second receiver 209 of the chip select signal receiver 205 and may disable the termination resistor RTT that is coupled to the chip select signal receiver 205, thereby reducing the power that is consumed during the period in which the self-refresh operation is performed. When the logic level of the second internal chip select signal ICS2 transitions from the second logic level to the first logic level after the self-refresh operation ends, the operation control circuit 217 may activate the enable signal EN. That is, when the self-refresh operation has ended, the operation control circuit 217 may enable the termination resistor RTT and the first receiver 207 based on the activated enable signal EN.

The internal circuit 219 may include a plurality of memory cells (not illustrated). The internal circuit 219 may perform a refresh operation on the plurality of memory cells during a period in which the internal self-refresh signal ISREF is activated.

Figure 3:
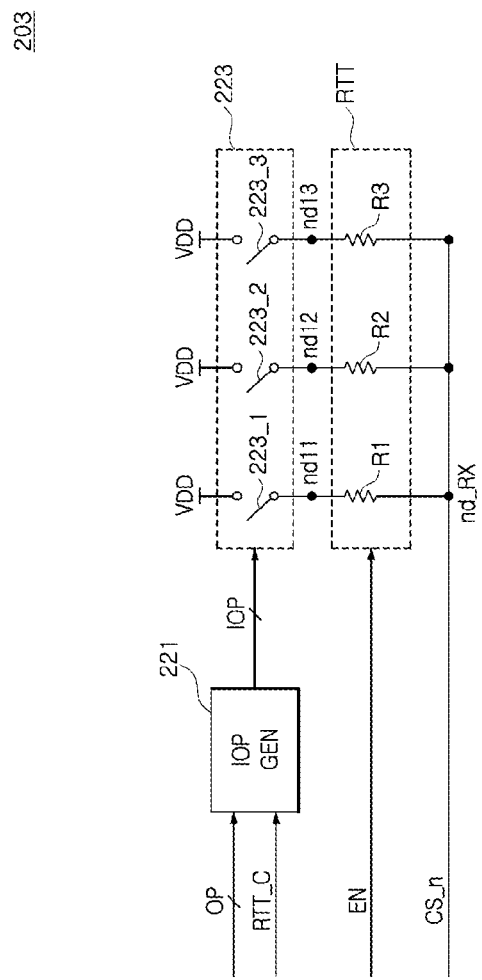
FIG. 3 is a diagram illustrating an example of an ODT (On-Die Termination) circuit, illustrated in FIG. 2.

FIG. 3 is a diagram illustrating an example of the ODT circuit 203, illustrated in FIG. 2. As illustrated in FIG. 3, the ODT circuit 203 may include an internal setting code generation circuit (IOP GEN) 221, the termination driver 223, and the termination resistor RTT.

The internal setting code generation circuit 221 may generate an internal setting code IOP based on the setting code OP and the resistor value change signal RTT_C. When the resistor value change signal RTT_C is deactivated, the internal setting code generation circuit 221 may output the setting code OP as the internal setting code IOP. That is, when the resistor value change signal RTT_C is deactivated, the internal setting code generation circuit 221 may generate the internal setting code IOP with the same logic level combination as that of the setting code OP. For example, when the resistor value change signal RTT_C is deactivated, the internal setting code generation circuit 221 may set the logic level combination of the internal setting code IOP to 'H, H, H', which are equal to the logic level combination of the setting code OP. When the resistor value change signal RTT_C is activated, the internal setting code generation circuit 221 may set the combination of the internal setting code IOP to a preset combination. The preset logic level combination may be set to various combinations in different embodiments. For example, when the resistor value change signal RTT_C is activated, the internal setting code generation circuit 221 may set the logic level combination of the internal setting code IOP to 'H, L, L', regardless of the logic level combination of the setting code OP. The configuration and operation method of the internal setting code generation circuit 221 will be described below with reference to FIGS. 4 and 5.

The termination driver 223 may include switching elements 223_1, 223_2, and 223_3. The number of switching elements may be set to various values in different embodiments. The switching element 223_1 may be coupled between a terminal of the supply voltage VDD and an internal node nd11. The switching element 223_2 may be coupled between the terminal of the supply voltage VDD and an internal node nd12. The switching element 223_3 may be coupled between the terminal of the supply voltage VDD and an internal node nd13. In different embodiments, one end of each switching element may be coupled to a terminal of the ground voltage VSS. The logic level combination of the internal setting code IOP may decide whether to turn on the switching elements 223_1 to 223_3 that are included in the termination driver 223. For example, when the logic level combination of the internal setting code IOP is 'H, H, H', the switching elements 223_1 to 223_3 may be all turned on. For another example, when the logic level combination of the internal setting code IOP is 'H, L, L', the switching element 223_1 may be turned on, and the switching elements 223_2 and 223_3 may be turned off. That is, the drivability of the termination driver 223 may be adjusted according to the logic level combination of the internal setting code IOP.

The termination resistor RTT may include resistance elements R1, R2, and R3. The number of resistance elements may vary in different embodiments. The resistance values of the resistance elements R1, R2, and R3 may be set to various values in different embodiments. The resistance element R1 may be coupled between the internal node nd11 and the receiving node nd_RX that receives the chip select signal CS_n. The resistance element R2 may be coupled between the receiving node nd_RX and the internal node nd12. The resistance element R3 may be coupled between the receiving node nd_RX and the internal node nd13. The value of the termination resistor RTT may be adjusted according to whether the switching elements 223_1 to 223_3 are turned on. The termination resistor RTT may be enabled during a period in which the enable signal EN is activated. More specifically, when the enable signal EN is activated, the resistance elements R1 to R3 may be enabled and may have their own resistance values. When the enable signal EN is deactivated, the resistance elements R1 to R3 may be disabled to stay in a high implement (High-Z) state.

Figure 4:
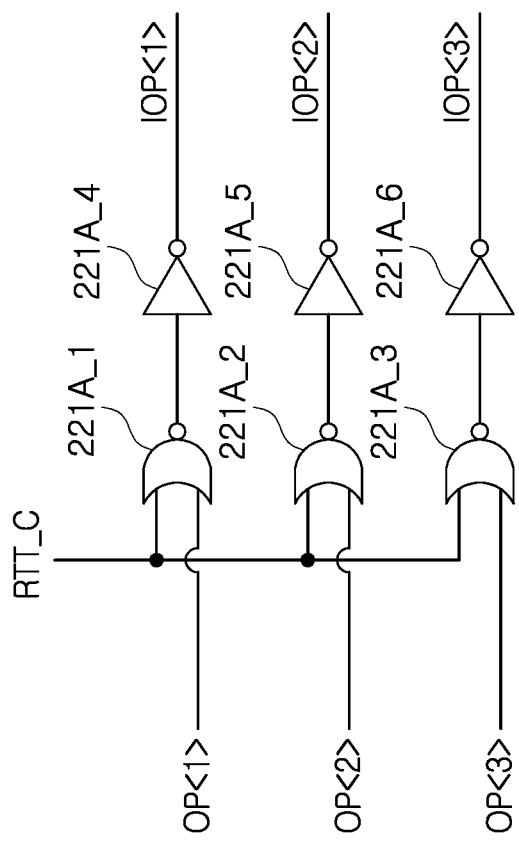
FIG. 4 is a circuit diagram illustrating an example of an internal setting code generation circuit, illustrated in FIG. 3.

FIG. 4 is a circuit diagram illustrating an example of the internal setting code generation circuit 221, illustrated in FIG. 3. As illustrated in FIG. 4, an internal setting code generation circuit 221A may include NOR gates 221A_1, 221A_2, and 221A_3 and inverters 221A_4, 221A_5, and 221A_6. When the resistor value change signal RTT_C is deactivated to a logic low level, the NOR gate 221A_1 and the inverter 221A_4 may buffer a first bit OP<1> of the setting code and output the buffed bit as a first bit IOP<1> of the internal setting code. When the resistor value change signal RTT_C is activated to a logic high level, the NOR gate 221A_1 and the inverter 221A_4 may set the first bit IOP<1> of the internal setting code to a logic high level. The operations of the NOR gate 221A_2 and the inverter 221A_5 and the operations of the NOR gate 221A_3 and the inverter 221A_6 may be implemented in the same manner as those of the NOR gate 221A_1 and the inverter 221A_4.

Figure 5:
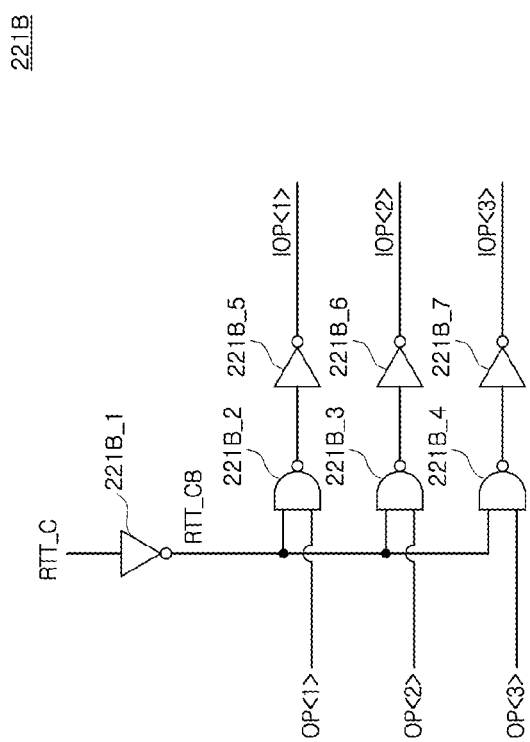
FIG. 5 is a circuit diagram illustrating another example of the internal setting code generation circuit, illustrated in FIG. 3.

FIG. 5 is a circuit diagram illustrating another example of the internal setting code generation circuit 221, illustrated in FIG. 3. As illustrated in FIG. 5, an internal setting code generation circuit 221B may include inverters 221B_1, 221B_5, 221B_6, and 221B_7 and NAND gates 221B_2, 221B_3, and 221B_4. The inverter 221B_1 may invert and buffer the resistor value change signal RTT_C and may output the inverted and buffered signal as an inverted resistor value change signal RTT_CB. When the inverted resistor value change signal RTT_CB is at a logic high level, the NAND gate 221B_2 and the inverter 221B_5 may buffer the first bit OP<1> of the setting code and output the buffed bit as the first bit IOP<1> of the internal setting code. When the inverted resistor value change signal RTT_CB is at a logic low level, the NAND gate 221B_2 and the inverter 221B_5 may set the first bit IOP<1> of the internal setting code to a logic low level. The operations of the NAND gate 221B_3 and the inverter 221B_6 and the operations of the NAND gate 221B_4 and the inverter 221B_7 are implemented in the same manner as those of the NAND gate 221B_2 and the inverter 221B_5.

Figure 6:
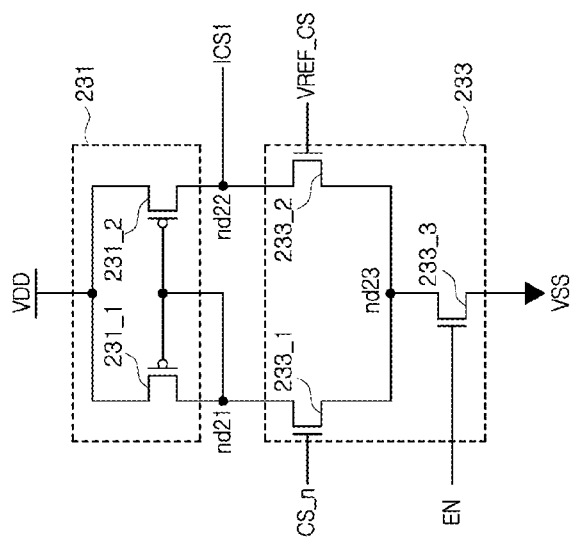
FIG. 6 is a circuit diagram illustrating an example of a first receiver, illustrated in FIG. 2.

FIG. 6 is a circuit diagram illustrating an example of the first receiver 207, illustrated in FIG. 2. As illustrated in FIG. 6, the first receiver 207 may include a charge supply circuit 231 and a charge release circuit 233.

The charge supply circuit 231 may include PMOS transistors 231_1 and 231_2. The PMOS transistor 231_1 may be coupled between the terminal of the supply voltage VDD and an internal node nd21. The PMOS transistor 231_1 may supply a charge to the internal node nd21 according to the level of the internal node nd21. The PMOS transistor 231_2 may be coupled between the terminal of the supply voltage VDD and an output node nd22. The PMOS transistor 231_2 may supply a charge to the output node nd22 from which the first internal chip select signal ICS1 is output, according to the level of the internal node nd21.

The charge release circuit 233 may include NMOS transistors 233_1, 233_2, and 233_3. The NMOS transistor 233_1 may be coupled between the internal node nd21 and an internal node nd23, and turned on according to the chip select signal CS_n. The NMOS transistor 233_2 may be coupled between the output node nd22 and the internal node nd23 and may be turned on according to the reference voltage VREF_CS. The NMOS transistor 233_3 may be coupled between the terminal of the ground voltage VSS and the internal node nd23. The NMOS transistor 233_3 may release the charge of the internal node nd23 when the enable signal EN is activated to a logic high level. When the enable signal EN has a logic high level and the chip select signal CS_n has a higher level than the reference voltage VREF_CS, the charge release circuit 233 may increase the amount of charge that is released from the internal node nd21 to be more than the amount of charge that is released from the output node nd22. Thus, the output node nd22 from which the first internal chip select signal ICS1 is output may be driven to a logic high level. When the enable signal EN has a logic high level and the chip select signal CS_n has a lower level than the reference voltage VREF_CS, the charge release circuit 233 may increase the amount of charge that is released from the output node nd22 to be more than the amount of charge that is released from the internal node nd21. Thus, the output node nd22 from which the first internal chip select signal ICS1 is output may be driven to a logic low level.

Figure 7:
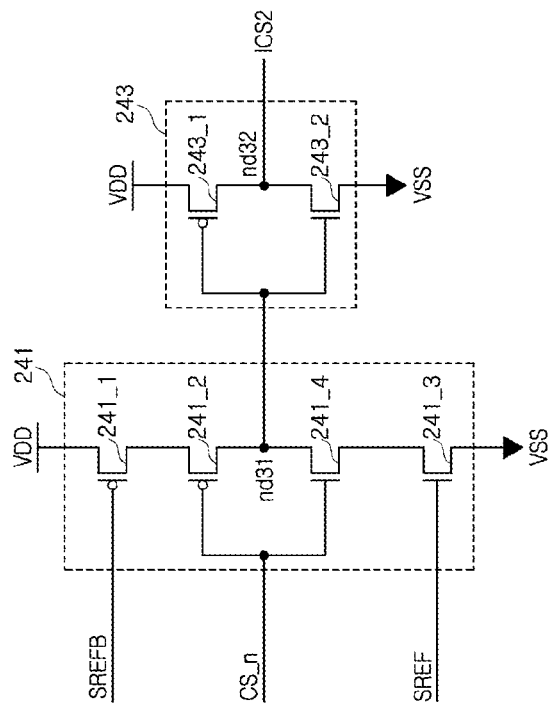
FIG. 7 is a circuit diagram illustrating an example of a second receiver, illustrated in FIG. 2.

FIG. 7 is a circuit diagram illustrating an example of the second receiver 209, illustrated in FIG. 2. As illustrated in FIG. 7, the second receiver 209 may include a first driving circuit 241 and a second driving circuit 243.

The first driving circuit 241 may include PMOS transistors 241_1 and 241_2 and NMOS transistors 241_3 and 241_4. The PMOS transistor 241_1 may be coupled between the terminal of the supply voltage VDD and the PMOS transistor 241_2 and may be turned on according to the logic level of an inverted self-refresh signal SREFB. The inverted self-refresh signal SREFB may be generated by inverting and buffering the self-refresh signal SREF. The PMOS transistor 241_2 may be coupled between the PMOS transistor 241_1 and an internal node nd31 and may be turned on according to the level of the chip select signal CS_n. When both are turned on according to the inverted self-refresh signal SREFB and the chip select signal CS_n, the PMOS transistor 241_1 and the PMOS transistor 241_2 may drive the internal node nd31 to a logic high level. The NMOS transistor 241_3 may be coupled between the terminal of the ground voltage VSS and the NMOS transistor 241_4 and may be turned on according to the logic level of the self-refresh signal SREF. The NMOS transistor 241_4 may be coupled between the internal node nd31 and the NMOS transistor 241_3 and may be turned on according to the level of the chip select signal CS_n. When both are turned on according to the self-refresh signal SREF and the chip select signal CS_n, the NMOS transistor 241_3 and the NMOS transistor 241_4 may drive the internal node nd31 to a logic low level.

The second driving circuit 243 may include a PMOS transistor 243_1 and an NMOS transistor 243_2. The PMOS transistor 243_1 may be coupled between the terminal of the supply voltage VDD and an output node nd32 from which the second internal chip select signal ICS2 is output. When the internal node nd31 is driven to a logic low level, the PMOS transistor 243_1 may drive the output node nd32 to a logic high level. The NMOS transistor 243_2 may be coupled between the terminal of the ground voltage VSS and the output node nd32. When the internal node nd31 is driven to a logic high level, the NMOS transistor 243_2 may drive the output node nd32 to a logic low level.

Figure 8:
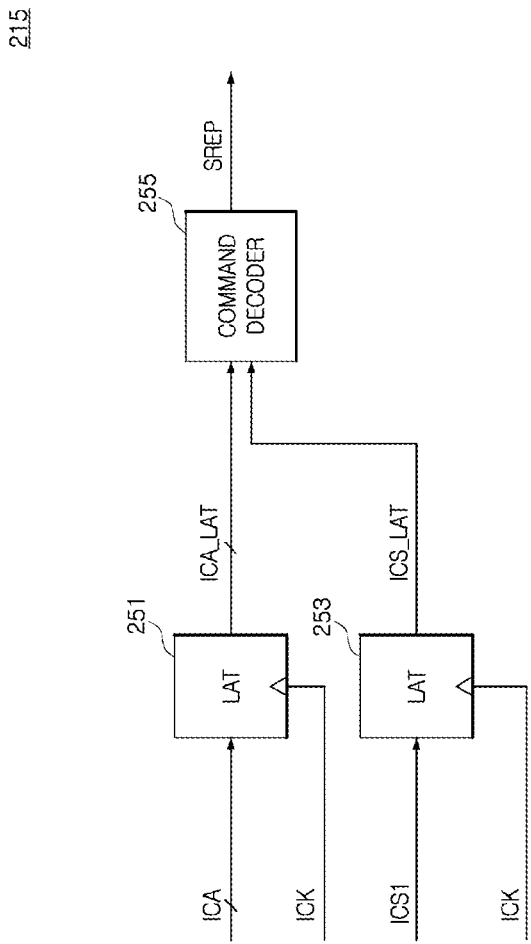
FIG. 8 is a diagram illustrating an example of a command pulse generation circuit, illustrated in FIG. 2.

FIG. 8 is a diagram illustrating an example of the command pulse generation circuit 215, illustrated in FIG. 2. As illustrated in FIG. 8, the command pulse generation circuit 215 may include a first latch circuit (LAT) 251, a second latch circuit (LAT) 253, and a command decoder 255.

The first latch circuit 251 may latch the internal command address ICA in synchronization with the internal clock ICK and output the latched internal command address ICA as a latched command address ICA_LAT.

The second latch circuit 253 may latch the first internal chip select signal ICS1 in synchronization with the internal clock ICK and output the latched first internal chip select signal ICS1 as a latched chip select signal ICS_LAT.

The command decoder 255 may generate the command pulse SREP by decoding the latched command address ICA_LAT based on the latched chip select signal ICS_LAT. More specifically, when the latched chip select signal ICS_LAT has a preset logic level, the command decoder 255 may generate the command pulse SREP by decoding the latched command address ICA_LAT with a logic level combination for entering into the self-refresh operation.

Figure 9:
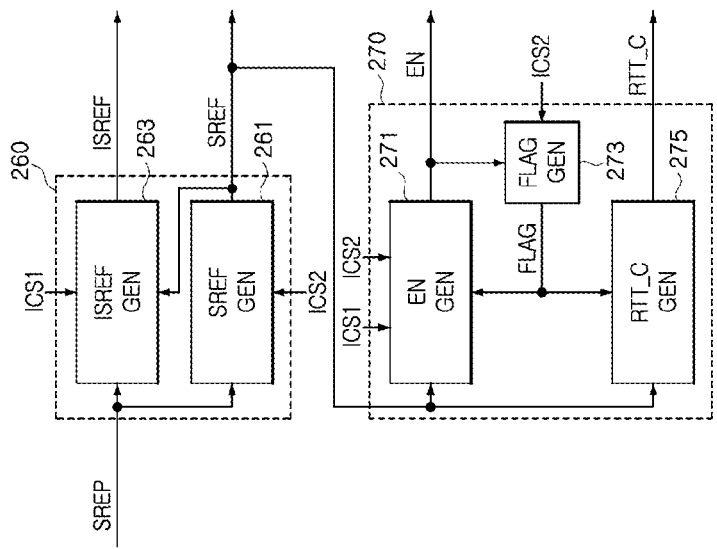
FIG. 9 is a block diagram illustrating an example of an operation control circuit, illustrated in FIG. 2.

FIG. 9 is a block diagram illustrating an example of the operation control circuit 217, illustrated in FIG. 2. As illustrated in FIG. 9, the operation control circuit 217 may include a self-refresh control circuit 260 and an internal operation control circuit 270.

The self-refresh control circuit 260 may include a self-refresh signal generation circuit (SREF GEN) 261 and an internal self-refresh signal generation circuit (ISREF GEN) 263. The self-refresh control circuit 260 may generate the self-refresh signal SREF and the internal self-refresh signal ISREF based on the command pulse SREP, the first internal chip select signal ICS1, and the second internal chip select signal ICS2.

The self-refresh signal generation circuit 261 may generate the self-refresh signal SREF based on the command pulse SREP and the second internal chip select signal ICS2. The self-refresh signal generation circuit 261 may activate the self-refresh signal SREF in synchronization with a point of time at which the command pulse SREP that is activated for entering into the self-refresh operation is deactivated. When the logic level of the second internal chip select signal ICS2 transitions from the second logic level to the first logic level after the self-refresh operation ends, the self-refresh signal generation circuit 261 may deactivate the self-refresh signal SREF. The configuration and operation method of the self-refresh signal generation circuit 261 will be described below in detail with reference to FIG. 10.

The internal self-refresh signal generation circuit 263 may generate the internal self-refresh signal ISREF based on the command pulse SREP, the self-refresh signal SREF, and the first internal chip select signal ICS1. The internal self-refresh signal generation circuit 263 may activate the internal self-refresh signal ISREF in synchronization with a point of time at which the command pulse SREP that is activated for entering into the self-refresh operation is deactivated. When the first internal chip select signal ICS1 has the preset logic level in a period in which the self-refresh signal SREF is deactivated, the internal self-refresh signal generation circuit 263 may deactivate the internal self-refresh signal ISREF. That is, when the first internal chip select signal ICS1 has the preset logic level after the end delay time elapses after the self-refresh operation ends, the internal self-refresh signal generation circuit 263 may deactivate the internal self-refresh signal ISREF. The configuration and operation method of the internal self-refresh signal generation circuit 263 will be described below in detail with reference to FIG. 11.

The internal operation control circuit 270 may include an enable signal generation circuit (EN GEN) 271, a flag generation circuit (FLAG GEN) 273, and a resistor value change signal generation circuit (RTT_C GEN) 275. The internal operation control circuit 270 may generate the enable signal EN and the resistor value change signal RTT_C based on the self-refresh signal SREF, the first internal chip select signal ICS1, and the second internal chip select signal ICS2.

The enable signal generation circuit 271 may generate the enable signal EN based on the self-refresh signal SREF, a flag FLAG, the first internal chip select signal ICS1, and the second internal chip select signal ICS2. The flag FLAG may be activated to indicate that the enable signal EN is deactivated and may be deactivated to indicate that the enable signal EN is activated. The enable signal generation circuit 271 may activate the enable signal EN when the self-refresh signal SREF is deactivated. When the first internal chip select signal ICS1 has the preset logic level in a period in which the self-refresh signal SREF is activated, the enable signal generation circuit 271 may deactivate the enable signal EN. That is, when the first internal chip select signal ICS1 has the preset logic level after the delay time elapses after the semiconductor device has entered the self-refresh operation, the enable signal generation circuit 271 may deactivate the enable signal EN. When the logic level of the second internal chip select signal ICS2 transitions from the second logic level to the first logic level while the flag FLAG is activated, the enable signal generation circuit 271 may activate the enable signal EN. That is, when the logic level of the second internal chip select signal ICS2 transitions from the second logic level to the first logic level after the self-refresh operation ends based on the flag FLAG that indicates that the enable signal EN is deactivated, the enable signal generation circuit 271 may activate the enable signal EN. The configuration and operation method of the enable signal generation circuit 271 will be described below in detail with reference to FIG. 12.

The flag generation circuit 273 may generate the flag FLAG based on the enable signal EN and the second internal chip select signal ICS2. When the second internal chip select signal ICS2 has the second logic level while the enable signal EN is deactivated, the flag generation circuit 273 may activate the flag FLAG to indicate that the enable signal EN is deactivated. When the enable signal EN is activated, the flag generation circuit 273 may deactivate the flag FLAG to indicate that the enable signal EN is activated. The configuration and operation method of the flag generation circuit 273 will be described below in detail with reference to FIG. 13.

The resistor value change signal generation circuit 275 may generate the resistor value change signal RTT_C based on the self-refresh signal SREF and the flag FLAG. When the self-refresh signal SREF is activated while the flag FLAG is deactivated, the resistor value change signal generation circuit 275 may activate the resistor value change signal RTT_C. That is, when the self-refresh signal SREF is activated based on the flag FLAG that indicates that the enable signal EN is activated, the resistor value change signal generation circuit 275 may activate the resistor value change signal RTT_C. When the flag FLAG is activated, the resistor value change signal generation circuit 275 may deactivate the resistor value change signal RTT_C. That is, the resistor value change signal generation circuit 275 may deactivate the resistor value change signal RTT_C based on the flag FLAG that indicates that the enable signal EN is deactivated. The configuration and operation method of the resistor value change signal generation circuit 275 will be described below in detail with reference to FIG. 14.

Figure 10:
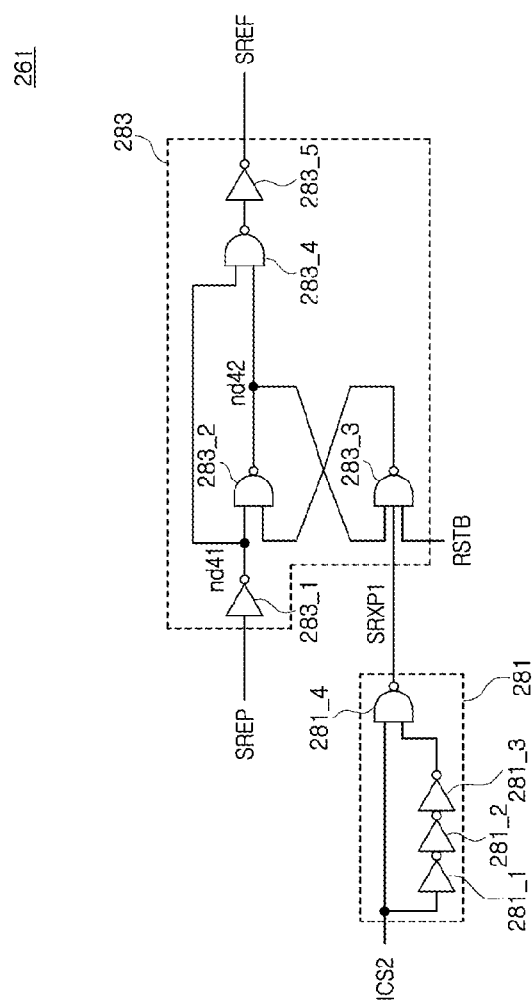
FIG. 10 is a circuit diagram illustrating an example of a self-refresh signal generation circuit, illustrated in FIG. 9.

FIG. 10 is a circuit diagram illustrating an example of the self-refresh signal generation circuit 261, illustrated in FIG. 9. As illustrated in FIG. 10, the self-refresh signal generation circuit 261 may include a first pulse generation circuit 281 and a first activation control circuit 283.

When the logic level of the second internal chip select signal ICS2 transitions from a logic low level to a logic high level after the self-refresh operation ends, the first pulse generation circuit 281 may generate a first self-refresh end pulse SPXP1 with a logic low level. The first pulse generation circuit 281 may be implemented as inverters 281_1, 281_2, and 281_3 and a NAND gate 281_4.

The first activation control circuit 283 may control the active state of the self-refresh signal SREF based on the first self-refresh end pulse SRXP1 and the command pulse SREP for entering into the self-refresh operation. The first activation control circuit 283 may activate the self-refresh signal SREF to a logic high level in synchronization with a point of time at which the command pulse SREP that is activated at a logic high level is deactivated to a logic low level. When the first self-refresh end pulse SRXP1 has a logic low level, the first activation control circuit 283 may deactivate the self-refresh signal SREF to a logic low level. The first activation control circuit 283 may include inverters 283_1 and 283_5 and NAND gates 283_2, 283_3, and 283_4. The inverter 283_1 may invert and buffer the command pulse SREP and output the inverted and buffered pulse to an internal node nd41. When the internal node nd41 is driven to a logic low level, the NAND gates 283_2 and 283_3 may drive an internal node nd42 to a logic high level. When the first self-refresh end pulse SRXP1 has a logic low level, the NAND gates 283_2 and 283_3 may drive the internal node nd42 to a logic low level. The NAND gates 283_2 and 283_3 may initialize the internal node nd42 to a logic low level based on a reset signal RSTB with a logic low level during an initialization operation. When the internal node nd41 is driven to a logic low level, the NAND gate 283_4 and the inverter 283_5 may set the self-refresh signal SREF to a logic low level. When the internal node nd41 is driven to a logic high level, the NAND gate 283_4 and the inverter 283_5 may buffer the signal of the internal node nd42 and output the buffered signal as the self-refresh signal SREF.

Figure 11:
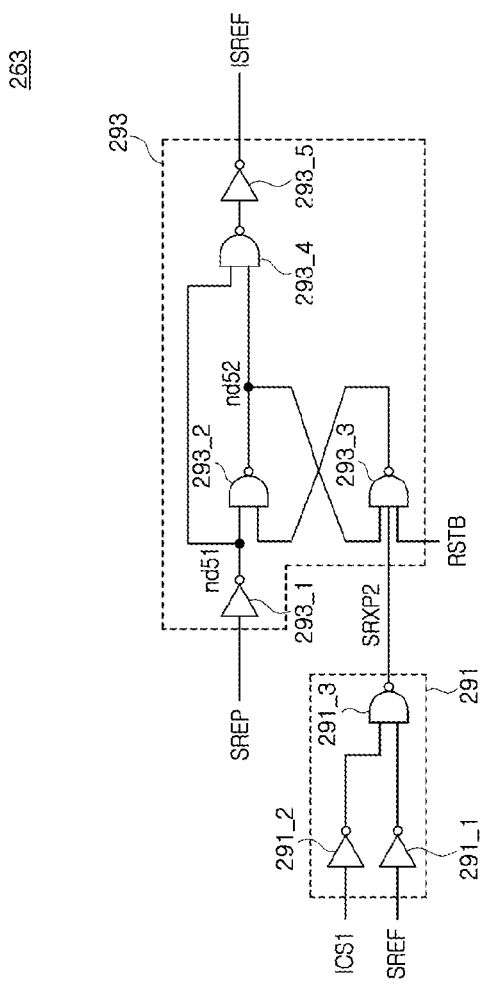
FIG. 11 is a circuit diagram illustrating an example of an internal self-refresh signal generation circuit, illustrated in FIG. 9.

FIG. 11 is a circuit diagram illustrating an example of the internal self-refresh signal generation circuit 263, illustrated in FIG. 9. As illustrated in FIG. 11, the internal self-refresh signal generation circuit 263 may include a second pulse generation circuit 291 and a second activation control circuit 293.

When the first internal chip select signal ICS1 has a logic low level in a period in which the self-refresh signal SREF is deactivated at a logic low level, the second pulse generation circuit 291 may generate a second self-refresh end pulse SRXP2 with a logic low level. The second pulse generation circuit 291 may be implemented as inverters 291_1 and 291_2 and a NAND gate 291_3.

The second activation control circuit 293 may control the active state of the internal self-refresh signal ISREF based on the second self-refresh end pulse SRXP2 and the command pulse SREP for entering into the self-refresh operation. The second activation control circuit 293 may activate the internal self-refresh signal ISREF to a logic high level in synchronization with a point of time at which the command pulse SREP that is activated at a logic high level is deactivated to a logic low level. When the second self-refresh end pulse SRXP2 has a logic low level, the second activation control circuit 293 may deactivate the internal self-refresh signal ISREF to a logic low level. The second activation control circuit 293 may include inverters 293_1 and 293_5 and NAND gates 293_2, 293_3, and 293_4. The operation method of the second activation control circuit 293 may be implemented in the same manner as the operation method of the first activation control circuit 283 illustrated in FIG. 10.

Figure 12:
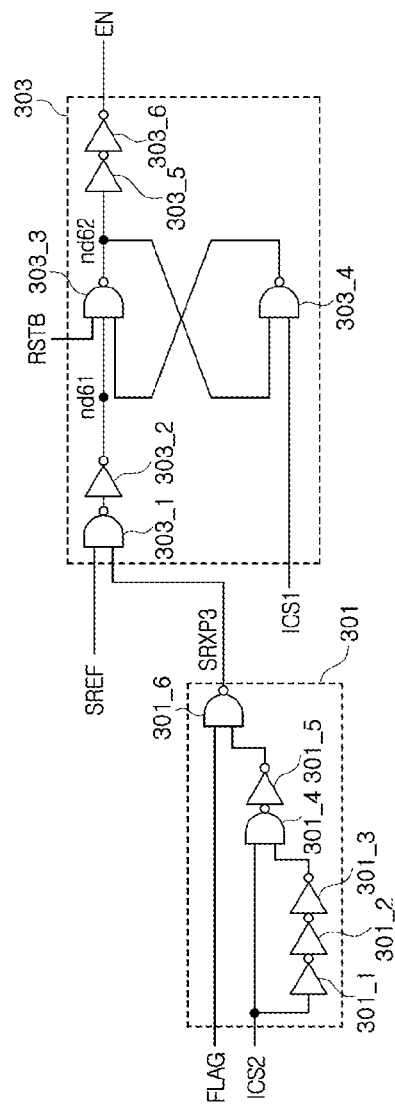
FIG. 12 is a circuit diagram illustrating an example of an enable signal generation circuit, illustrated in FIG. 9.

FIG. 12 is a circuit diagram illustrating an example of the enable signal generation circuit 271, illustrated in FIG. 9. As illustrated in FIG. 12, the enable signal generation circuit 271 may include a third pulse generation circuit 301 and a third activation control circuit 303.

When the logic level of the second internal chip select signal ICS2 transitions from a logic low level to a logic high level after the self-refresh operation ends based on the flag FLAG with a logic high level to indicate that the enable signal EN is deactivated, the third pulse generation circuit 301 may generate a third self-refresh end pulse SRXP3 with a logic low level. The third pulse generation circuit 301 may be implemented as inverters 301_1, 301_2, 301_3, and 301_5 and NAND gates 301_4 and 301_6.

The third activation control circuit 303 may control the active state of the enable signal EN based on the self-refresh signal SREF, the first internal chip select signal ICS1, and the third self-refresh end pulse SRXP3. The third activation control circuit 303 may activate the enable signal EN to a logic high level during a period in which the self-refresh signal SREF is deactivated to a logic low level. When the first internal chip select signal ICS1 has a logic low level in a period in which the self-refresh signal SREF is activated at a logic high level, the third activation control circuit 303 may deactivate the enable signal EN to a logic low level. When the third self-refresh end pulse SRXP3 has a logic low level, the third activation control circuit 303 may activate the enable signal EN to a logic high level. The third activation control circuit 303 may include NAND gates 303_1, 303_3, and 303_4 and inverters 303_2, 303_5, and 303_6. When the self-refresh signal SREF or the third self-refresh end pulse SRXP3 has a logic low level, the NAND gate 303_1 and the inverter 303_2 may drive an internal node nd61 to a logic low level. When the internal node nd61 is driven to a logic low level, the NAND gates 303_3 and 303_4 may drive an internal node nd62 to a logic high level. When both of the self-refresh signal SREF and the third self-refresh end pulse SRXP3 have a logic high level, the NAND gate 303_1 and the inverter 303_2 may drive the internal node nd61 to a logic high level. When the internal node nd61 is driven to a logic high level and the first internal chip select signal ICS1 has a logic low level, the NAND gates 303_3 and 303_4 may drive the internal node nd62 to a logic low level. The NAND gates 303_3 and 303_4 may initialize the internal node nd62 to a logic high level based on the reset signal RSTB with a logic low level during the initialization operation. The inverters 303_5 and 303_6 may buffer the signal of the internal node nd62 and output the buffered signal as the enable signal EN.

Figure 13:
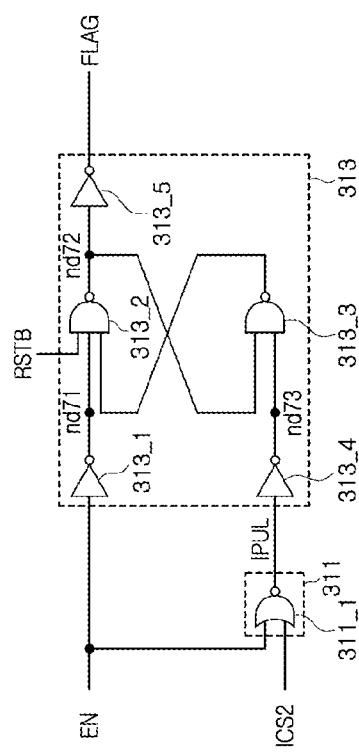
FIG. 13 is a circuit diagram illustrating an example of a flag generation circuit, illustrated in FIG. 9.

FIG. 13 is a circuit diagram illustrating an example of the flag generation circuit 273, illustrated in FIG. 9. As illustrated in FIG. 13, the flag generation circuit 273 may include a fourth pulse generation circuit 311 and a fourth activation control circuit 313.

The fourth pulse generation circuit 311 may generate an internal pulse IPUL based on the enable signal EN and the second internal chip select signal ICS2. When the enable signal EN is activated to a logic high level, the fourth pulse generation circuit 311 may drive the internal pulse IPUL to a logic low level. When the enable signal EN is deactivated to a logic low level and the second internal chip select signal ICS2 has a logic low level, the fourth pulse generation circuit 311 may drive the internal pulse IPUL to a logic high level. The fourth pulse generation circuit 311 may be implemented as a NOR gate 311_1.

The fourth activation control circuit 313 may control the active state of the flag FLAG based on the enable signal EN and the internal pulse IPUL. When the enable signal EN is activated to a logic high level, the fourth activation control circuit 313 may deactivate the flag FLAG to a logic low level. When the internal pulse IPUL is at a logic high level, the fourth activation control circuit 313 may activate the flag FLAG to a logic high level. The fourth activation control circuit 313 may include inverters 313_1, 313_4, and 313_5 and NAND gates 313_2 and 313_3. When the enable signal EN has a logic high level, the inverter 313_1 may drive an internal node nd71 to a logic low level. When the internal node nd71 is driven to a logic low level, the NAND gates 313_2 and 313_3 may drive an internal node nd72 to a logic high level. When the internal pulse IPUL has a logic high level, the inverter 313_4 may drive an internal node nd73 to a logic low level. When the internal node nd73 is driven to a logic low level, the NAND gates 313_2 and 313_3 may drive the internal node nd72 to a logic low level. The inverter 313_5 may invert and buffer the signal of the internal node nd72 and may output the inverted and buffered signal as the flag FLAG.

Figure 14:
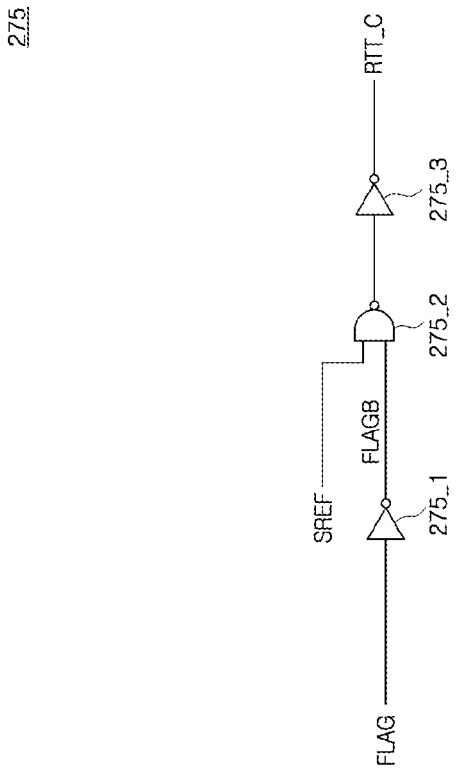
FIG. 14 is a circuit diagram illustrating an example of a resistor value change signal generation circuit, illustrated in FIG. 9.

FIG. 14 is a circuit diagram illustrating an example of the resistor value change signal generation circuit 275, illustrated in FIG. 9. As illustrated in FIG. 14, the resistor value change signal generation circuit 275 may include inverters 275_1 and 275_3 and a NAND gate 275_2. The inverter 275_1 may generate an inverted flag FLAGB by inverting and buffering the flag FLAG. The inverted flag FLAGB may have a logic high level to indicate that the enable signal (EN of FIG. 9) is activated. The inverted flag FLAGB may have a logic low level to indicate that the enable signal EN is deactivated. When the self-refresh signal SREF is activated to a logic high level and the inverted flag FLAGB has a logic high level to indicate that the enable signal (EN of FIG. 9) is activated, the NAND gate 275_2 and the inverter 275_3 may activate the resistor value change signal RTT_C to a logic high level. When the inverted flag FLAGB has a logic low level to indicate that the enable signal EN is deactivated, the NAND gate 275_2 and the inverter 275_3 may deactivate the resistor value change signal RTT_C to a logic low level.

Figure 15:
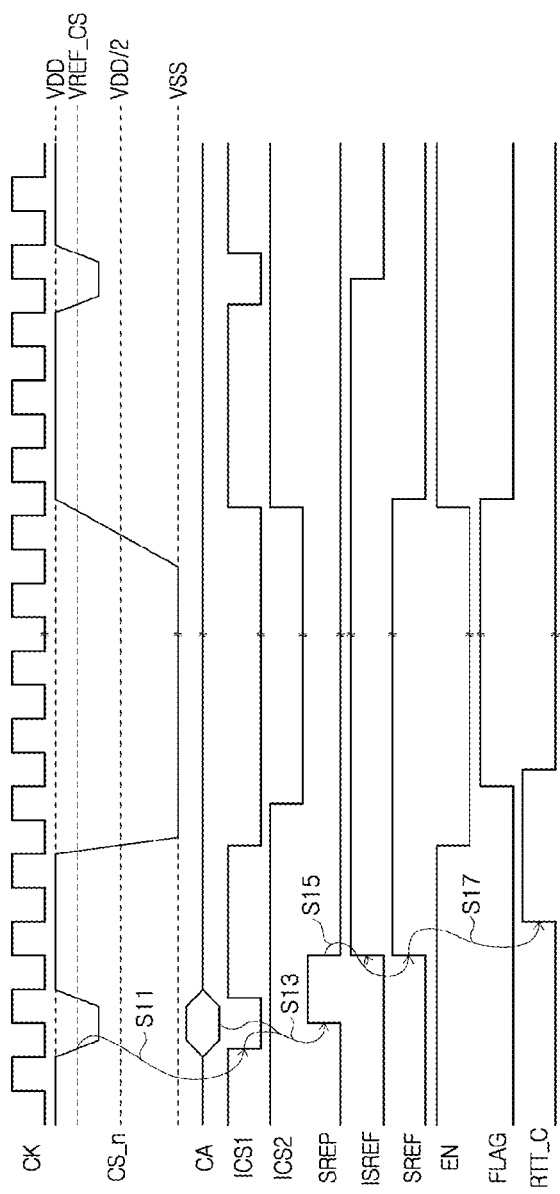
FIGS. 15 to 18 are timing diagrams for describing an operation performed by the semiconductor device, illustrated in FIG. 2.

FIG. 15 is a timing diagram for describing an operation that is performed when the semiconductor device 120, illustrated in FIG. 2 enters the self-refresh operation. As illustrated in FIG. 15, the semiconductor device 120 may receive the clock CK, the chip select signal CS_n, and the command address CA from the controller (110 of FIG. 1). The preset level of the chip select signal CS_n may be set to the level of the supply voltage VDD, the first target level of the chip select signal CS_n may be set between the level of the supply voltage VDD and half the level of the supply voltage VDD, and the second target level of the chip select signal CS_n may be set to the level of the ground voltage VSS.

In step S11, when the level of the chip select signal CS_n transitions from the preset level to the first target level such that the semiconductor device enters the self-refresh operation, the first receiver 207 may set the first internal chip select signal ICS1 to the preset logic level by comparing the level of the chip select signal CS_n to the level of the reference voltage VREF_CS.

In step S13, when the first internal chip select signal ICS1 has the preset logic level, the command pulse generation circuit 215 may generate the command pulse SREP from the command address CA with a logic level combination for entering into the self-refresh operation.

In step S15, the operation control circuit 217 may activate the self-refresh signal SREF and the internal self-refresh signal ISREF based on the command pulse SREP. The operation control circuit 217 may enable the second receiver 209 based on the activated self-refresh signal SREF. In step S17, the operation control circuit 217 may activate the resistor value change signal RTT_C for adjusting the value of the termination resistor (RTT of FIG. 3) to the preset value based on the activated self-refresh signal SREF.

Figure 16:
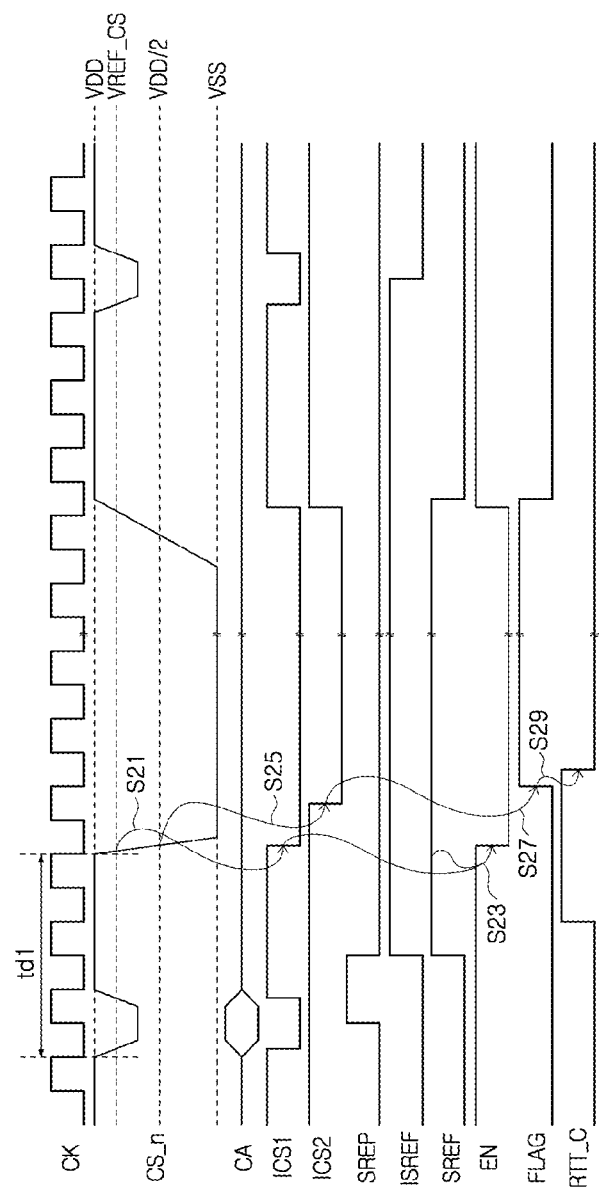

FIG. 16 is a timing diagram for describing an operation that is performed when a delay time td1 elapses after the semiconductor device 120, illustrated in FIG. 2, has entered the self-refresh operation.

In step S21, when the level of the chip select signal CS_n transitions from the preset level to the second target level after the delay time td1 elapses after the semiconductor device has entered the self-refresh operation, the first receiver 207 may set the first internal chip select signal ICS1 to the preset logic level by comparing the level of the chip select signal CS_n to the level of the reference voltage VREF_CS.

In step S23, when the first internal chip select signal ICS1 has the preset logic level in a period in which the self-refresh signal SREF is activated, the operation control circuit 217 may deactivate the enable signal EN to disable the first receiver 207 and the termination resistor (RTT of FIG. 3). Thus, when the delay time td1 elapses after the semiconductor device has entered the self-refresh operation, the operation control circuit 217 may switch the first receiver 207 of the chip select signal receiver 205 to the second receiver 209 of the chip select signal receiver 205.

In step S25, when the level of the chip select signal CS_n transitions from the preset level to the second target level after the delay time td1 elapses after the semiconductor device has entered the self-refresh operation, the second receiver 209 may change the logic level of the second internal chip select signal ICS2 from the first logic level to the second logic level.

In step S27, when the logic level of the second internal chip select signal ICS2 transitions from the first logic level to the second logic level in a period in which the enable signal EN is deactivated, the operation control circuit 217 may activate the flag (FLAG of FIG. 9). In step S29, when the flag FLAG is activated, the operation control circuit 217 may deactivate the resistor value change signal RTT_C in order to set the value of the termination resistor (RTT of FIG. 3) to a value that is set by the mode register 201.

Figure 17:
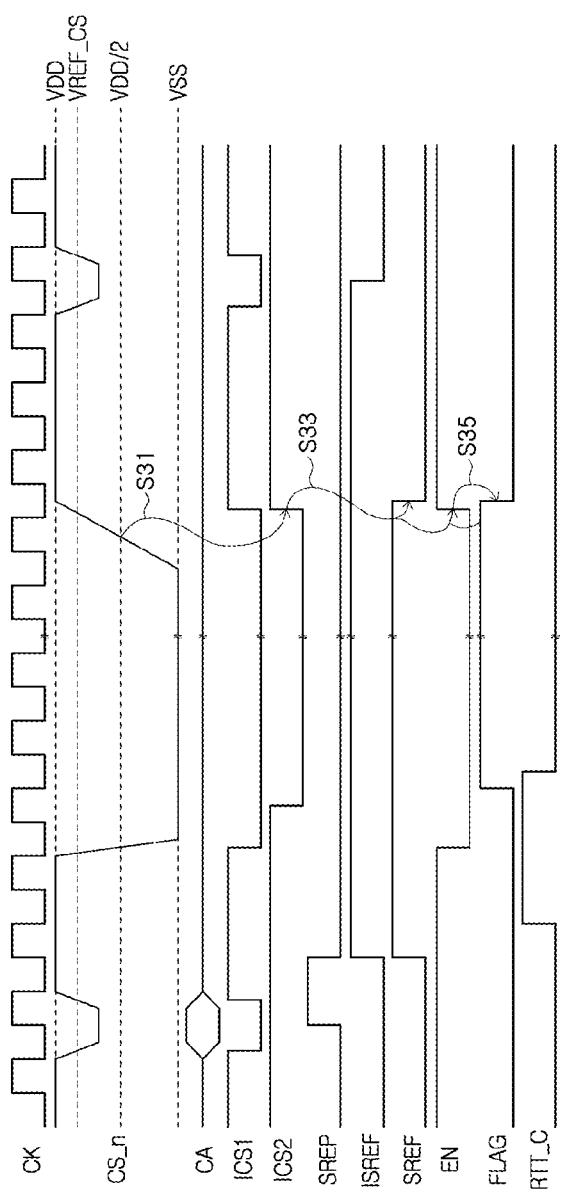

FIG. 17 is a timing diagram for describing an operation that is performed when the semiconductor device 120, illustrated in FIG. 2, ends the self-refresh operation.

In step S31, when the level of the chip select signal CS_n transitions from the second target level to the preset level such that the semiconductor device ends the self-refresh operation, the second receiver 209 may change the logic level of the second internal chip select signal ICS2 from the second logic level to the first logic level.

In step S31, when the logic level of the second internal chip select signal ICS2 transitions from the second logic level to the first logic level, the operation control circuit 217 may deactivate the self-refresh signal SREF. The operation control circuit 217 may disable the second receiver 209 based on the deactivated self-refresh signal SREF. Furthermore, in step S33, when the logic level of the second internal chip select signal ICS2 transitions from the second logic level to the first logic level, the operation control circuit 217 may activate the enable signal EN to enable the first receiver 207 and the termination resistor (RTT of FIG. 3) based on the activated flag (FLAG of FIG. 9). Thus, the operation control circuit 217 may switch the second receiver 209 of the chip select signal receiver 205 to the first receiver 207 of the chip select signal receiver 205, when the semiconductor device ends the self-refresh operation.

In step S35, when the enable signal EN is activated, the operation control circuit 217 may deactivate the activated flag FLAG.

Figure 18:
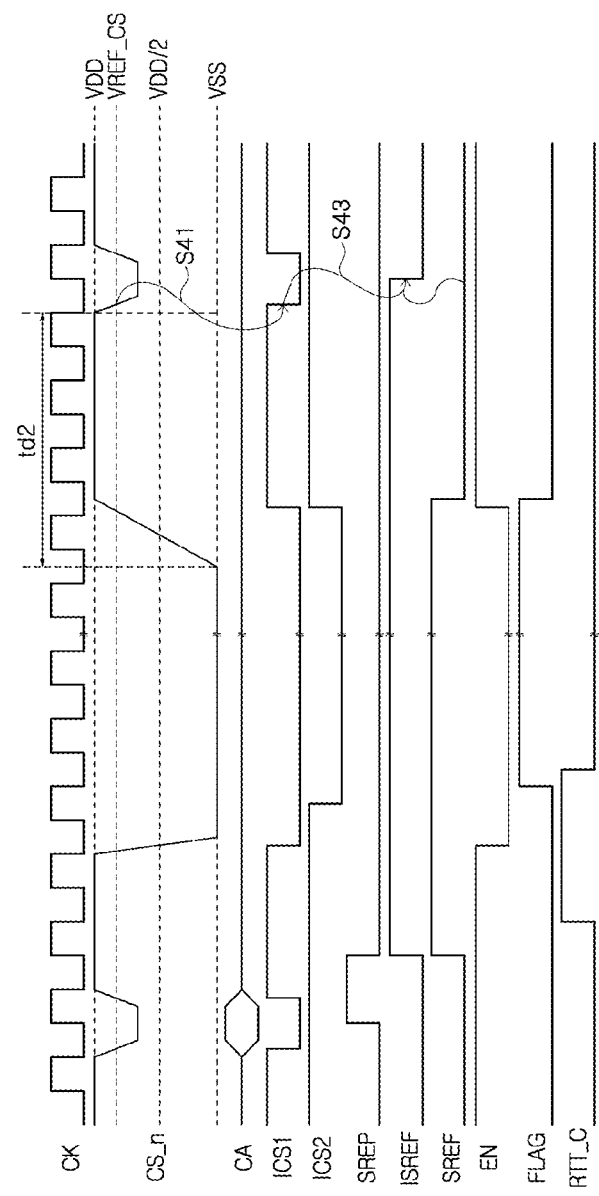

FIG. 18 is a timing diagram for describing an operation that is performed when an end delay time td2 elapses after the semiconductor device 120, illustrated in FIG. 2, has entered the self-refresh operation.

In step S41, when the level of the chip select signal CS_n transitions from the preset level to the first target level after the end delay time td2 elapses after the semiconductor device has ended the self-refresh operation, the first receiver 207 may compare the level of the chip select signal CS_n to the level of the reference voltage VREF_CS, and set the first internal chip select signal ICS1 to the preset logic level.

In step S43, when the first internal chip select signal ICS1 has the preset logic level in a period in which the self-refresh signal SREF is deactivated, the operation control circuit 217 may deactivate the internal self-refresh signal ISREF.

As described above, the semiconductor device in accordance with the present embodiment may adjust the value of the termination resistor coupled to the receiver that receives the chip select signal when the semiconductor device enters the self-refresh operation to stably control a level variation of the chip select signal, thereby preventing a malfunction that is caused by the level variation of the chip select signal in the self-refresh operation. Furthermore, when the delay time elapses after the semiconductor device has entered the self-refresh operation, the semiconductor device may switch the receiver that receives the chip select signal, and disable the termination resistor coupled to the receiver that receives the chip select signal, thereby reducing the power that is consumed during the period in which the self-refresh operation is performed.

In accordance with some embodiments, the semiconductor device may adjust the value of the termination resistor coupled to the receiver that receives the chip select signal when the semiconductor device enters the self-refresh operation to stably control a level variation of the chip select signal, thereby preventing a malfunction caused by the level variation of the chip select signal in the self-refresh operation.

Furthermore, when the delay time elapses after the semiconductor device has entered the self-refresh operation, the semiconductor device may switch the receiver that receives the chip select signal, and disable the termination resistor coupled to the receiver that receives the chip select signal, thereby reducing the power that is consumed during the period in which the self-refresh operation is performed.

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. A semiconductor device comprising:
   a first receiver configured to receive a chip select signal from a receiving node to which a termination resistor is coupled and configured to generate a first internal chip select signal;
   a command pulse generation circuit configured to generate a command pulse for entering into a self-refresh operation based on an internal command address and the first internal chip select signal; and
   an operation control circuit configured to, when the semiconductor device enters the self-refresh operation based on the command pulse, generate a resistor value change signal that adjusts a value of the termination resistor,
   wherein, when the level of the chip select signal transitions from a preset level to a first target level, such that the semiconductor device enters the self-refresh operation, the first receiver is configured to set a logic level of the first internal chip select signal to a preset logic level.

2. The semiconductor device of claim 1, further comprising an On-Die Termination (ODT) circuit that includes the termination resistor,
   wherein the ODT circuit is configured to:
      set the value of the termination resistor to a preset value when the resistor value change signal is activated, and
      set the value of the termination resistor to a value that is set by a mode register when the resistor value change signal is deactivated.

3. The semiconductor device of claim 1, wherein the first receiver is implemented as a differential amplifier configured to amplify a difference between the level of the chip select signal and the level of a reference voltage and configured to drive an output node from which the first internal chip select signal is output,
   wherein the level of the reference voltage is set between the preset level and the first target level.

4. The semiconductor device of claim 1, wherein, when the first internal chip select signal has the preset logic level, the command pulse generation circuit is configured to generate the command pulse by decoding the internal command address with a logic level combination for entering into the self-refresh operation.

5. The semiconductor device of claim 1, wherein, when the level of the chip select signal transitions from the preset level to a second target level after a delay time elapses after the semiconductor device has entered the self-refresh operation, the first receiver is configured to set the logic level of the first internal chip select signal to the preset logic level,
wherein the difference between the preset level and the second target level is set to a larger value than the difference between the preset level and the first target level.

6. The semiconductor device of claim 5, wherein the operation control circuit is configured to:
activate a self-refresh signal when the semiconductor device enters the self-refresh operation based on the command pulse, and
disable the termination resistor and the first receiver when the first internal chip select signal has the preset logic level in a period in which the self-refresh signal is activated.

7. The semiconductor device of claim 1, further comprising a second receiver configured to receive the chip select signal from the receiving node and configured to generate a second internal chip select signal.

8. The semiconductor device of claim 7, wherein the second receiver is implemented as a Complementary Metal-Oxide Semiconductor (CMOS) buffer, configured to drive an output node from which the second internal chip select signal is output, according to the level of the chip select signal.

9. The semiconductor device of claim 7, wherein the operation control circuit is configured to enable the second receiver when the semiconductor device enters the self-refresh operation based on the command pulse.

10. The semiconductor device of claim 7, wherein, when the level of the chip select signal transitions from the preset level to a second target level after the delay time elapses after the semiconductor device has entered the self-refresh operation, the second receiver is configured to change the logic level of the second internal chip select signal from a first logic level to a second logic level.

11. The semiconductor device of claim 10, wherein, when the logic level of the second internal chip select signal transitions from the first logic level to the second logic level, the operation control circuit is configured to deactivate the resistor value change signal.

12. The semiconductor device of claim 10, wherein, when the level of the chip select signal transitions from the second target level to the preset level such that the semiconductor device ends the self-refresh operation, the second receiver is configured to change the logic level of the second internal chip select signal from the second logic level to the first logic level.

13. The semiconductor device of claim 12, wherein, when the logic level of the second internal chip select signal transitions from the second logic level to the first logic level, the operation control circuit is configured to enable the termination resistor and the first receiver.

14. The semiconductor device of claim 12, wherein, when the logic level of the second internal chip select signal transitions from the second logic level to the first logic level, the operation control circuit is configured to disable the second receiver.

15. A semiconductor device comprising:
an operation control circuit configured to generate a resistor value change signal when a level of a chip select signal transitions so that the semiconductor device enters a self-refresh operation; and
an ODT (On-Die Termination) circuit comprising a termination resistor coupled to a receiving node that receives the chip select signal and configured to adjust a value of the termination resistor based on the resistor value change signal,
wherein, when the level of the chip select signal transitions from a preset level to a first target level such that the semiconductor device enters the self-refresh operation, the operation control circuit is configured to activate the resistor value change signal.

16. The semiconductor device of claim 15, wherein, when the resistor value change signal is activated, the ODT circuit is configured to adjust the value of the termination resistor from a value that is set by a mode register to a preset value.

17. The semiconductor device of claim 15, wherein, when the level of the chip select signal transitions from the preset level to a second target level such that the semiconductor device enters the self-refresh operation, the operation control circuit is configured to deactivate the resistor value change signal,
wherein the difference between the preset level and the second target level is set to a larger value than the difference between the preset level and the first target level.

18. The semiconductor device of claim 17, wherein, when the resistor value change signal is deactivated, the ODT circuit is configured to set the value of the termination resistor to a value that is set by a mode register.

* * * * *